(12) United States Patent
Chang et al.

(10) Patent No.: US 7,728,344 B2
(45) Date of Patent: Jun. 1, 2010

(54) LIGHT EMITTING DIODE

(75) Inventors: Chung-Min Chang, Miao-Li Hsien (TW); Chih-Peng Hsu, Miao-Li Hsien (TW); Chun-Wei Wang, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 0 days.

(21) Appl. No.: 12/242,591

(22) Filed: Sep. 30, 2008

(65) Prior Publication Data
US 2009/0152582 A1    Jun. 18, 2009

(30) Foreign Application Priority Data
Dec. 12, 2007  (CN) .......................... 2007 1 0203009

(51) Int. Cl.
*H01L 33/00* (2006.01)
(52) U.S. Cl. ............................ 257/98; 257/100; 257/99; 257/102
(58) Field of Classification Search .................. 257/98, 257/100, 99, 103, 79, 81, 91, 82; 362/84, 362/257
See application file for complete search history.

(56) References Cited

U.S. PATENT DOCUMENTS

| 6,310,364 | B1 * | 10/2001 | Uemura ....................... 257/100 |
| 6,340,824 | B1 * | 1/2002 | Komoto et al. ................. 257/99 |
| 6,593,598 | B2 * | 7/2003 | Ishinaga ....................... 257/98 |
| 6,717,355 | B2 * | 4/2004 | Takahashi et al. ........... 313/503 |
| 6,835,958 | B2 * | 12/2004 | Uemura ....................... 257/79 |
| 7,026,663 | B2 * | 4/2006 | Krames et al. .............. 257/103 |

* cited by examiner

*Primary Examiner*—Chuong A. Luu
(74) *Attorney, Agent, or Firm*—Andrew C. Cheng

(57) ABSTRACT

A light emitting diode includes a reflective cup, an LED chip, and many electrodes, a first light scattering layer, and a phosphor layer. The reflective cup includes a bottom and a sidewall extending from the bottom. The LED chip is received in the reflective cup and mounted on the bottom thereof for emitting first light of a first wavelength. The electrodes each has a first end electrically connected to the LED chip and an opposite second end exposed at an outer surface of the reflective cup. The first light scattering layer formed in the reflective cup on the bottom thereof and covering the LED chip, which has a concave surface at an opposite side thereof to the LED chip. The phosphor layer formed on the concave surface of the light scattering layer for converting part of the first light into second light of a second wavelength.

11 Claims, 5 Drawing Sheets

LIGHT EMITTING DIODE

CROSS-REFERENCE TO RELATED APPLICATION

This application claims all benefits accruing under 35 U.S.C. §119 from China Patent Application No. 200710203009.2, filed on Dec. 12, 2007 in the China Intellectual Property Office, the disclosures of which are incorporated herein by reference.

BACKGROUND

1. Technical Field

The present invention generally relates to light emitting diodes.

2. Description of Related Art

Light emitting diodes (LEDs) as solid-state illuminating apparatuses, are being widely used in the illumination field to substitute for conventional fluorescent lamps due to their high brightness, long service lifetime, and wide color gamut. Relevant subject matter is disclosed in an article entitled "Solid-State Lighting: Toward Superior Illumination", published in *Proceedings of the IEEE*, Vol. 93, No. 10, by Michael S. Shur et al. in October, 2005, the disclosure of which is incorporated herein by reference.

Referring to FIG. 5, a typical white light LED 10 includes a reflective cup 11, a LED chip 12, and an encapsulant 13 configured for encapsulating the LED chip 12. The reflective cup 11 includes a receiving groove 110, a positive electrode 111, and a negative electrode 112. The LED chip 12 is placed on a bottom 1102 of the receiving groove 110, and a side wall 1104 of the receiving groove 110 surrounds the LED chip 12 to collect light from the LED chip 12 and redirect it to an opening 1106 of the receiving groove 110. The opening 1106 of the receiving groove 110 is opposite to the bottom 1102. The positive electrode 111 and the negative electrode 112 are used to contact a power source (not shown). The LED chip 12 is position on the positive electrode 111 and is wire bonded to the negative electrode 112. The encapsulant 13 is doped with a plurality of phosphor particles 132, and is positioned in the receiving groove 110, and the phosphor particles 132 are deposited on the LED chip 12 to surround it. Thus, the phosphor particles 132 can be excited by blue light from the LED chip 12 to emit yellow light, and white light can be formed by mixture of the yellow light and the residuary blue light. The phosphor particles 132 surrounds the LED chip 12, thereby improving the light uniformity and the mixing light efficiency of the white light LED 10. However, the temperature of the LED chip 12 is usually high e.g. above 80° C., resulting decrease of the converted efficiency of the phosphor particles 132.

What is needed, therefore, is a light emitting diode with good light uniformity, which can overcome the above-mentioned disadvantages.

SUMMARY

A light emitting diode includes a reflective cup, an LED chip, and many electrodes, a first light scattering layer, and a phosphor layer. The reflective cup includes a bottom and a sidewall extending from the bottom, the sidewall comprising an inner reflective surface. The LED chip is received in the reflective cup and mounted on the bottom thereof, the LED chip being configured for emitting first light of a first wavelength. The electrodes each has a first end electrically connected to the LED chip and an opposite second end exposed at an outer surface of the reflective cup. The first light scattering layer includes a first light pervious matrix and many light scattering particles dispersed therein, the first light scattering layer formed in the reflective cup on the bottom thereof and covering the LED chip. The first light scattering layer has a concave surface at an opposite side thereof to the LED chip, the first light scattering layer being configured for scattering the first light. The phosphor layer includes a second light pervious matrix and phosphor particles dispersed therein, which formed on the concave surface of the light scattering layer for converting part of the first light into second light of a second wavelength.

Other advantages and novel features will become more apparent from the following detailed description of the present invention, when taken in conjunction with the accompanying drawings.

BRIEF DESCRIPTION OF THE DRAWINGS

Many aspects of the present devices can be better understood with reference to the following drawings. The components in the drawings are not necessarily drawn to scale, the emphasis instead being placed upon clearly illustrating the principles of the present devices. Moreover, in the drawings, like reference numerals designate corresponding parts throughout the several views.

DETAILED DESCRIPTION OF THE EMBODIMENTS

Figure 1:
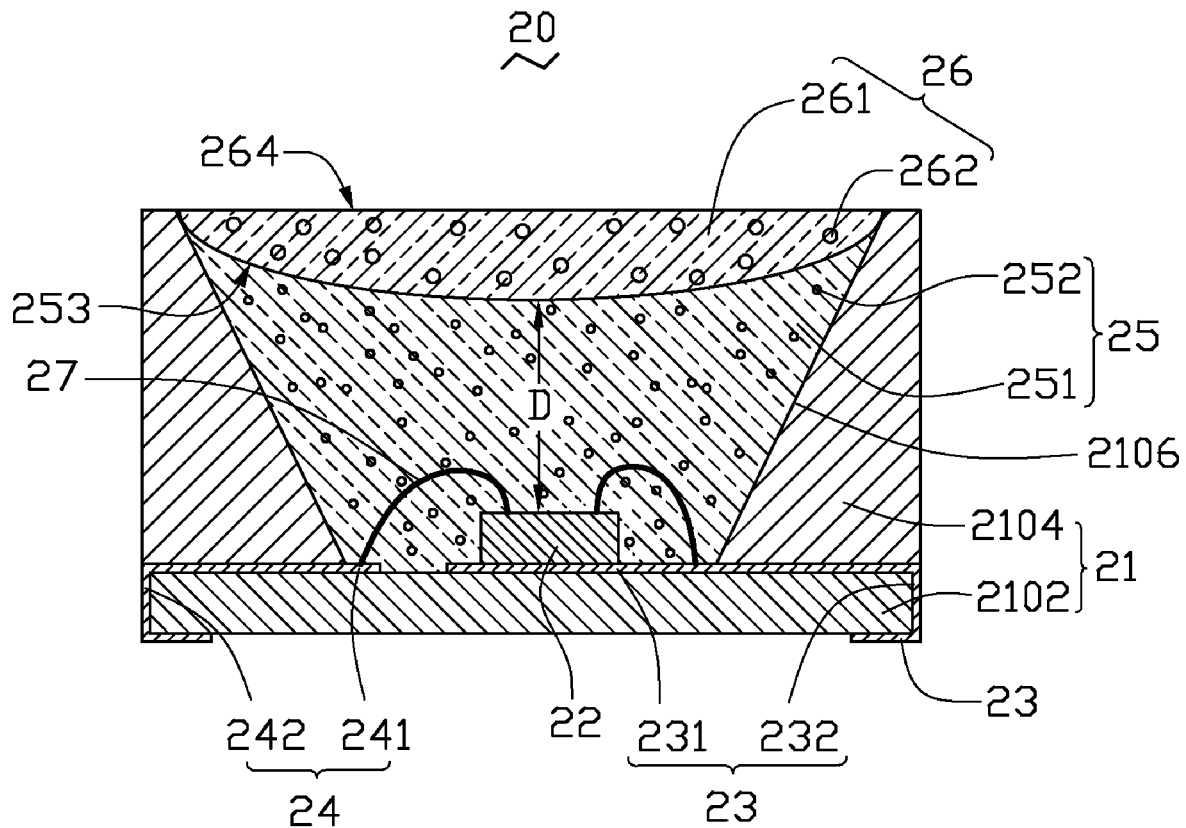
FIG. 1 is a cross-sectional view of the light emitting diode with a second filling layer of a first exemplary embodiment.

Referring to FIG. 1, a light emitting diode 20 in accordance with a first exemplary embodiment includes a reflective cup 21, a LED chip 22, a first electrode 23, a second electrode 24, a first light scattering layer 25 and a phosphor layer 26.

The reflective cup 21 includes a bottom 2102 and a sidewall 2104 extending from the bottom 2102. The sidewall 2104 includes an inner reflective surface which is configured for collecting light from the LED chip 22 and redirects it towards a top portion of the reflective cup 21. The reflective cup 21 defines a frustoconic receiving space 2106 enclosed by the bottom 2102 and the sidewall 2104.

The first electrode 23 and the second electrode 24 are positioned on the bottom 2102. The first electrode 23 is positioned on one end of bottom 2102 and has a first end 231 exposed in the receiving space 2106 and an opposite second end 232 exposed at an outer surface of the bottom 2102. The second electrode 24 is located on the other end of bottom 2102 and has a first end 241 exposed in the receiving space 2106 and an opposite second end 242 exposed at an outer surface of the bottom 2102. The LED chip 22 is received in the receiving space 2106 and mounted on the bottom 2102 of the reflective cup 21 for emitting first light of a first wavelength. The LED chip 22 is electrically connected to the first end 231 of the first electrode 23 and the second end 241 of the second electrodes 24. In the exemplary embodiment, the LED chip 22 is placed on the first end 231 of the first electrode 23 and is wire bonded to the first and second electrodes 23, 24 by wires 27. The first and second electrodes 23, 24 are used to cooperatively supply electrical power to the LED chip 22.

The first light scattering layer 25 is formed in the receiving space 2106 on the bottom 2102 to cover the LED chip 22. The first light scattering layer 25 protects the LED chip 22 from mechanical damage, moisture, and atmospheric exposure. The first light scattering layer 25 also increases light extraction efficiency from the die relative to the LED chip 22 in air.

The first light scattering layer 25 includes a first light pervious matrix 251 and a plurality of light scattering particles 252 evenly dispersed in the first light pervious matrix 251. The first light pervious matrix 251 can be an epoxy, silicone, or other light-pervious materials. In the exemplary embodiment, the light pervious matrix 251 is silicone and has a refractive index of greater than 1.4. The light scattering particles 252 can be made of $TiO_2$, plastic, PMMA, fused silica, $Al_2O_3$, MgO, sialon, or the other transparent nitrogen oxides. The refractive index of the light scattering particles 252 is in a range from 1.1 to 2.4, and is different from the refractive index of first light pervious matrix 251. In addition, the light scattering particles 252 may be spherical, strip shaped or the other shape, and each of the particles has a size less than 3 microns. In the exemplary embodiment, the light scattering particles 252 is spherical and with a particle size in range from 0.5 to 2.5 microns. The first light scattering layer 25 includes a concave surface 253 at an opposite side of thereof to the LED chip 22. A minimum distance D between the concave surface 253 and the LED chip 22 is greater than or equal to 50 microns, to encapsulating the wires 27 in the first light scattering layer 25.

The light scattering particles 252 is used to scatter light from the LED chip 22, herein as an example that the LED chip 22 being configured for emitting blue light is described. The blue light emitted from the LED chip 22 is evenly scattered by the light scattering particles 252. Furthermore, the blue light can be reflected by the inner surface of the annular sidewall 2104 to improve the light utilization efficiency of the light emitting diode 20.

The phosphor layer 26 is placed on the first light scattering layer 25 facing away from the LED chip 22. The phosphor layer 26 includes a second light pervious matrix 261 and a plurality of phosphor particles 262 evenly dispersed in the second light pervious matrix 261. The second light pervious matrix 261 can be an epoxy, silicone, or other light-pervious materials. A refractive index of the second light pervious matrix 261 is greater than or equal to that of the silicone matrix 251, such that the light is not trapped in the first light scattering layer 25 by total internal reflection (TIR), thereby increasing light emission efficiency of the light emitting diode 20.

The phosphor particles 262 may be made of YAG, silicate, nitride, or oxide. The phosphor particles 262 may be spherical, strip shaped or the other shape, and with a particle size in a range from 40 to 80 microns, such that the phosphor particles 262 can be mixed in the phosphor layer 26 evenly. The phosphor particles 262 are configured for converting part of the first light emitted from the LED chip 22 into second light with a second wavelength, and white light can be formed by mixture of the first and second light. In the exemplary embodiment, the phosphor particles 262 are made of YAG and excited by part of blue light from the LED chip 22 to emit yellow light, and white light can be formed by mixture of the yellow light and the residuary part of the blue light.

The blue light evenly dispersed from the first light scattering layer 25 emits into the phosphor layer 26 through the concave surface 253, and white light with good uniformity can be emitted from the phosphor layer 26. In addition, because of the phosphor particles 262 in the phosphor layer 26 are dispersed away from the LED chip 22, heat generated from the LED chip 22 has little influence to the phosphor particles 262, so that the phosphor particles 262 has a stable converting efficiency.

Figure 2:
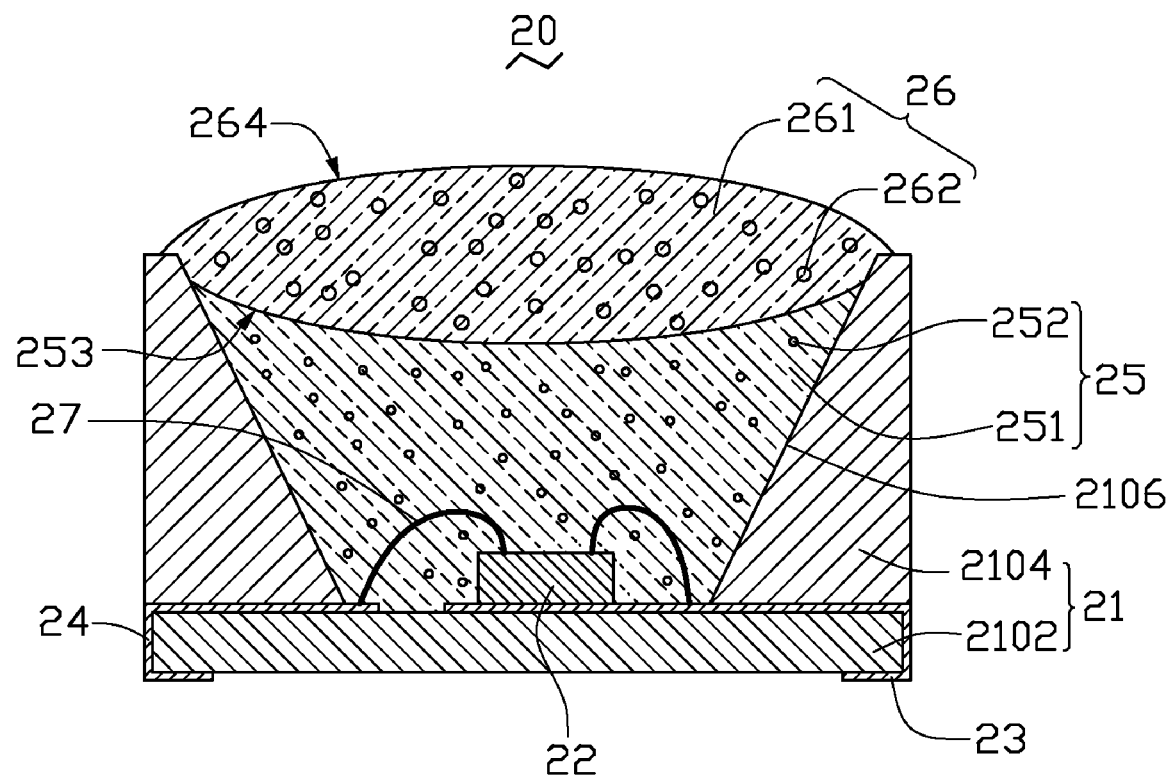
FIG. 2 is a cross-sectional view of the light emitting diode in FIG. 1 and the second filling layer having a convex light emitting surface away from the LED chip.

Referring to FIG. 2, the phosphor layer 26 has a light emitting surface 264 at an opposite side thereof to the concave surface 253 of the first light scattering layer 25. The light emitting surface 264 is a convex surface configured for collecting light from the LED chip 22 to improve light gathering of the light emitting diode 20. That is, radiation range of the light emitting diode 20 can be collected by this convex light emitting surface 264. In addition, the concave light emitting surface 264 may be designed with different curvatures to change the light gathering of the light emitting diode 20, thus light field shape of the light emitting diode 20 can be adjusted.

Figure 3:
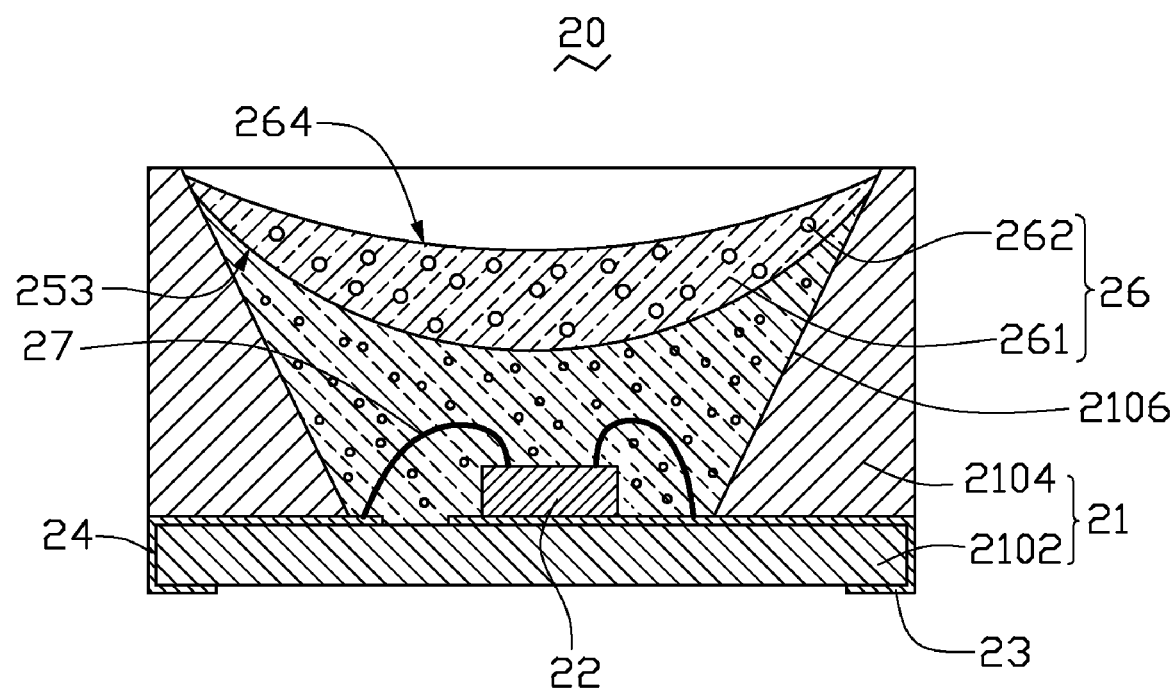
FIG. 3 is a cross-sectional view of the light emitting diode in FIG. 1 and the second filling layer having a concave light emitting surface adjacent to the LED chip.

Referring to FIG. 3, the light emitting surface 264 is a concave surface, and configured for diverging light from the LED chip 22 to enlarge radiation range of the light emitting diode 20. In addition, the light emitting surface 264 may be designed with different curvatures to change the light divergence of the light emitting diode 20, thus light field shape of the light emitting diode 20 can be adjusted. It can be understood that, the light emitting surface 264 of the phosphor layer 26 may be a plane or an arbitrary surface.

Furthermore, thickness of middle portion of the phosphor layer 26 is thicker than that of periphery portion thereof, and the phosphor particles 262 are evenly dispersed in the second light pervious matrix 261, so there are more phosphor particles 262 in the middle portion than the periphery portion of the phosphor layer 26. In addition, the upright top position of the LED chip 22 has the highest intensity. Thus, the more blue light emitted through the middle portion of the phosphor layer 26, the more phosphor particles 262 can be excited by the blue light to emit yellow light, so that uniformity of the white light mixed by the blue light and the yellow light can be further improved.

Figure 4:
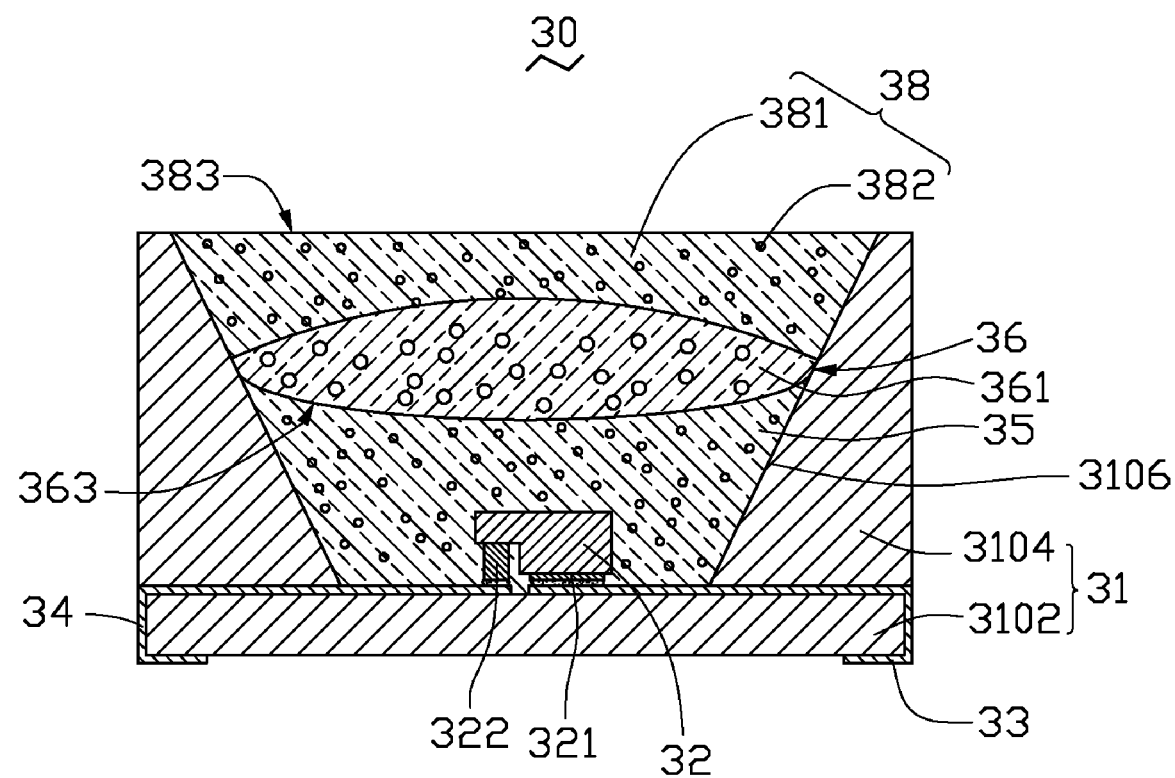
FIG. 4 is a cross-sectional view of the light emitting diode of a second exemplary embodiment.
Figure 5:
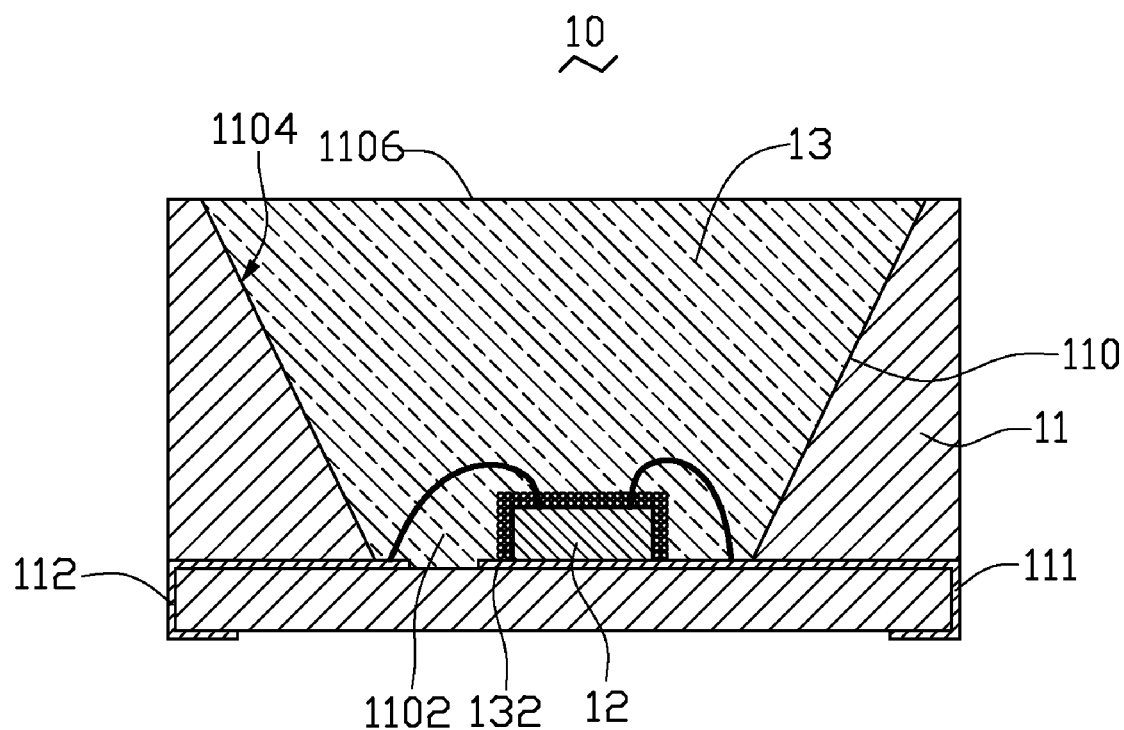
FIG. 5 is a cross-sectional view of a typical light emitting diode.

Referring to FIG. 4, a light emitting diode 30, in accordance with a second embodiment, is provided. The light emitting diode 30 is similar to that of the first embodiment, except that a bottom 3102 and a sidewall 3104 are integrally formed. A LED chip 32 includes a first contacting electrode 321 and a paralleled second contacting electrode 322. The contacting electrodes 321, 322 are electrically connected to the first electrode 33 and the second electrode 34 respectively by solders. The light emitting diode 30 further includes a second light scattering layer 38 formed on an opposite side of the phosphor layer 36 to the first light scattering layer 35. The second light scattering layer 38 includes a third light pervious matrix 381 and a plurality of light scattering particles 382 evenly dispersed in the third light pervious matrix 381. The light scattering particles 382 are used to scatter white light emitted from the phosphor layer 36, to further improve uniformity of the white light of the light emitting diode 30. A refractive index of the third light pervious matrix 381 is less than or equal to that of the second light pervious matrix 361 to reduce light loss from the top surface of the phosphor layer 36 by total internal reflection (TIR), thereby increasing light emission efficiency of the light emitting diode 30.

It can be understood that, because the LED chip 32 is formed on bottom of the receiving space 3106 by flip chip technology, a minimum distance between the concave surface 363 and the LED chip 32 may be less than 50 microns, so long as encapsulates the LED chip 32 in the first light scattering layer 35.

The second light scattering layer 38 has a light emitting surface 383 facing away from the phosphor layer 36, and the light emitting surface 383 may be a plane or an arbitrary surface. Furthermore, the light emitting surface 383 may be a convex or concave surface, and configured for collecting or diverging light from the LED chip 32, to change radiation range and light field shape of the light emitting diode 30.

It can be understood that, the light emitting diode 20 or 30 may includes a plurality of LED chips and a plurality of electrodes electrically connected to the LED chips.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A light emitting diode comprising:
    a reflective cup comprising a bottom and a sidewall extending from the bottom, the sidewall comprising an inner reflective surface;
    an LED chip received in the reflective cup and mounted on the bottom thereof, the LED chip being configured for emitting first light of a first wavelength;
    a plurality of electrodes having first ends electrically connected to the LED chip and opposite second ends exposed at an outer surface of the reflective cup;
    a first light scattering layer comprising a first light pervious matrix and a plurality of light scattering particles dispersed therein, the first light scattering layer formed in the reflective cup on the bottom thereof and covering the LED chip, the first light scattering layer having a concave surface at an opposite side thereof to the LED chip, the first light scattering layer being configured for scattering the first light; and
    a phosphor layer comprising a second light pervious matrix and phosphor particles dispersed therein, the phosphor layer formed on the concave surface of the light scattering layer, the phosphor layer being configured for converting part of the first light into second light of a second wavelength.

2. The light emitting diode of claim 1, wherein the bottom and the sidewall are integrally formed.

3. The light emitting diode of claim 1, wherein the reflective cup defines a frustoconic receiving space with the LED chip and the light scattering layer received therein.

4. The light emitting diode of claim 1, wherein a refractive index of the second matrix is greater than or equal to that of the first light pervious matrix.

5. The light emitting diode of claim 1, wherein a minimum distance between the concave surface of the first light scattering layer and the LED chip is greater than or equal to 50 microns.

6. The light emitting diode of claim 1, wherein the phosphor layer having a convex light emitting surface at an opposite side thereof to the first light scattering layer.

7. The light emitting diode of claim 1, wherein the phosphor layer having a concave light emitting surface at an opposite side thereof to the first light scattering layer.

8. The light emitting diode of claim 1, wherein the phosphor layer comprises a flat light emitting surface at an opposite side thereof to the first light scattering layer.

9. The light emitting diode of claim 1, further comprising a second light scattering layer formed on an opposite side of the phosphor layer to the first scattering layer, the second light scattering layer comprising a plurality of light scattering particles dispersed therein.

10. The light emitting diode of claim 9, wherein the second scattering layer has a convex light emitting surface facing away from the phosphor layer.

11. The light emitting diode of claim 9, wherein the second light scattering layer comprises a flat surface at an opposite side thereof to the phosphor layer.

* * * * *